(12) United States Patent
Vogel et al.

(10) Patent No.: US 7,623,750 B2
(45) Date of Patent: Nov. 24, 2009

(54) BEND RADIUS POST

(75) Inventors: Mark A. Vogel, Hinsdale, IL (US);
Walter J. Moehle, New Lenox, IL (US);
Brett A. Swett, Bolingbrook, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/946,998

(22) Filed: Nov. 29, 2007

(65) Prior Publication Data

US 2008/0123301 A1 May 29, 2008

Related U.S. Application Data

(60) Provisional application No. 60/867,646, filed on Nov. 29, 2006.

(51) Int. Cl.
*G02B 6/00* (2006.01)
(52) U.S. Cl. ....................... 385/135; 385/134
(58) Field of Classification Search ................. 385/134, 385/135
See application file for complete search history.

(56) References Cited

U.S. PATENT DOCUMENTS

| 3,906,146 | A | 9/1975 | Taylor |
|---|---|---|---|
| 4,776,662 | A | 10/1988 | Valleix |
| 5,142,606 | A | 8/1992 | Carney et al. |
| 5,487,123 | A | 1/1996 | Fowble |
| 5,715,348 | A | 2/1998 | Falkenberg et al. |
| 5,758,002 | A | 5/1998 | Walters |
| D404,010 | S | 1/1999 | Viklund et al. |
| 6,044,194 | A | 3/2000 | Meyerhoefer |
| 6,256,444 | B1 | 7/2001 | Bechamps et al. |
| 6,307,997 | B1 | 10/2001 | Walters et al. |
| 6,384,330 | B1 | 5/2002 | Squillante et al. |
| D463,253 | S | 9/2002 | Canty |
| 6,504,094 | B2 | 1/2003 | Woo et al. |
| 6,553,172 | B2 | 4/2003 | Lortie et al. |
| 6,785,459 | B2 | 8/2004 | Schmidt et al. |
| 6,796,437 | B2 | 9/2004 | Krampotich et al. |
| D509,479 | S | 9/2005 | DePaola |
| 7,362,941 | B2 * | 4/2008 | Rinderer et al. ............. 385/134 |

* cited by examiner

*Primary Examiner*—Jennifer Doan
(74) *Attorney, Agent, or Firm*—Robert A. McCann; Christopher S. Clancy; Aimee E. McVady

(57) ABSTRACT

A cable manager is mounted to vertical rails of an enclosure. The cable manager includes a plurality of bend radius posts individually mounted to the enclosure. Each bend radius post includes a shaft and at least one removable retention tab positioned at one end of the shaft. The opposite end of the shaft is mounted to the vertical rail in the enclosure. The bend radius posts manage and protect the cables routed within the enclosure.

11 Claims, 8 Drawing Sheets

BEND RADIUS POST

CROSS-REFERENCE TO RELATED APPLICATION

This application claims priority to U.S. Provisional Patent Application No. 60/867,646, filed Nov. 29, 2006, the subject matter of which is hereby incorporated herein by reference in its entirety.

FIELD OF THE INVENTION

The present invention relates to cable managers and more particularly to a bend radius post for managing cables entering and exiting a horizontal cable manager.

BACKGROUND OF THE INVENTION

A variety of cable managers are known for routing the wires and cables of electronic equipment, such as telecommunications equipment and computers. In some cases cable managers comprise a vertical manager with a plurality of fingers. The vertical cable manager is typically mounted to the rails in an enclosure or a rack for routing wires and cables within the enclosure or rack. The vertical cable managers are mounted to the rails at predetermined positions where a plurality of holes are available. Current vertical cable managers, however, may not be adjusted to accommodate the various cable sizes used in the industry. Thus, there is a need for a more efficient and adjustable cable manager that routes wires and cable within an enclosure.

SUMMARY

The present invention is directed toward a cable manager that routes cables in an enclosure. The cable manager includes a bend radius post having a shaft and at least one removable retention tab. The retention tab is positioned at one end of the shaft. The opposite end of the shaft of the bend radius post is mounted to a vertical rail in the enclosure. The installed bend radius post manages and protects the cables routed within the enclosure.

DETAILED DESCRIPTION

Figure 1:
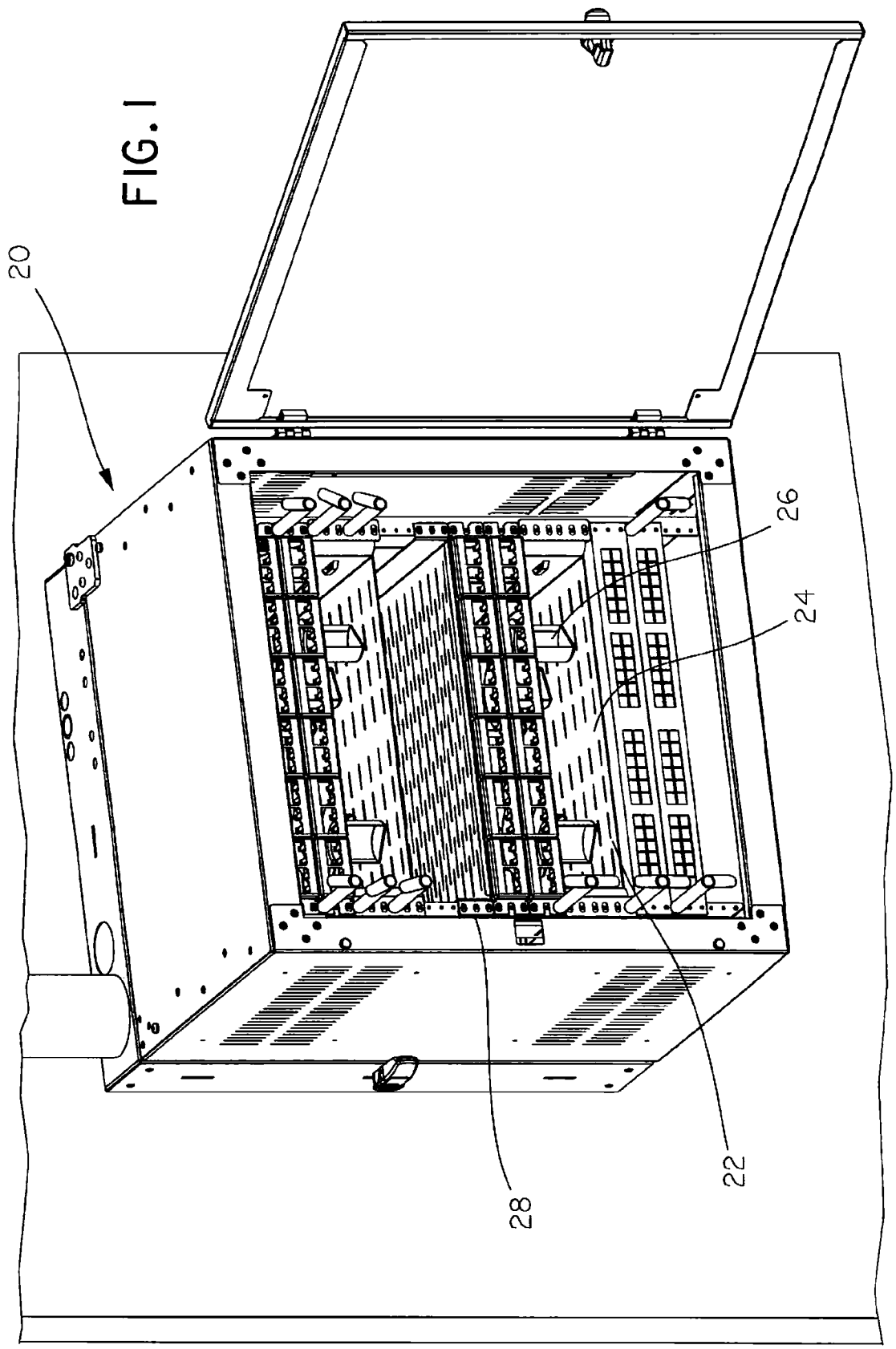
FIG. 1 is a perspective view of a wall mount enclosure with a cable manager apparatus including the bend radius posts of the present invention.
Figure 2:
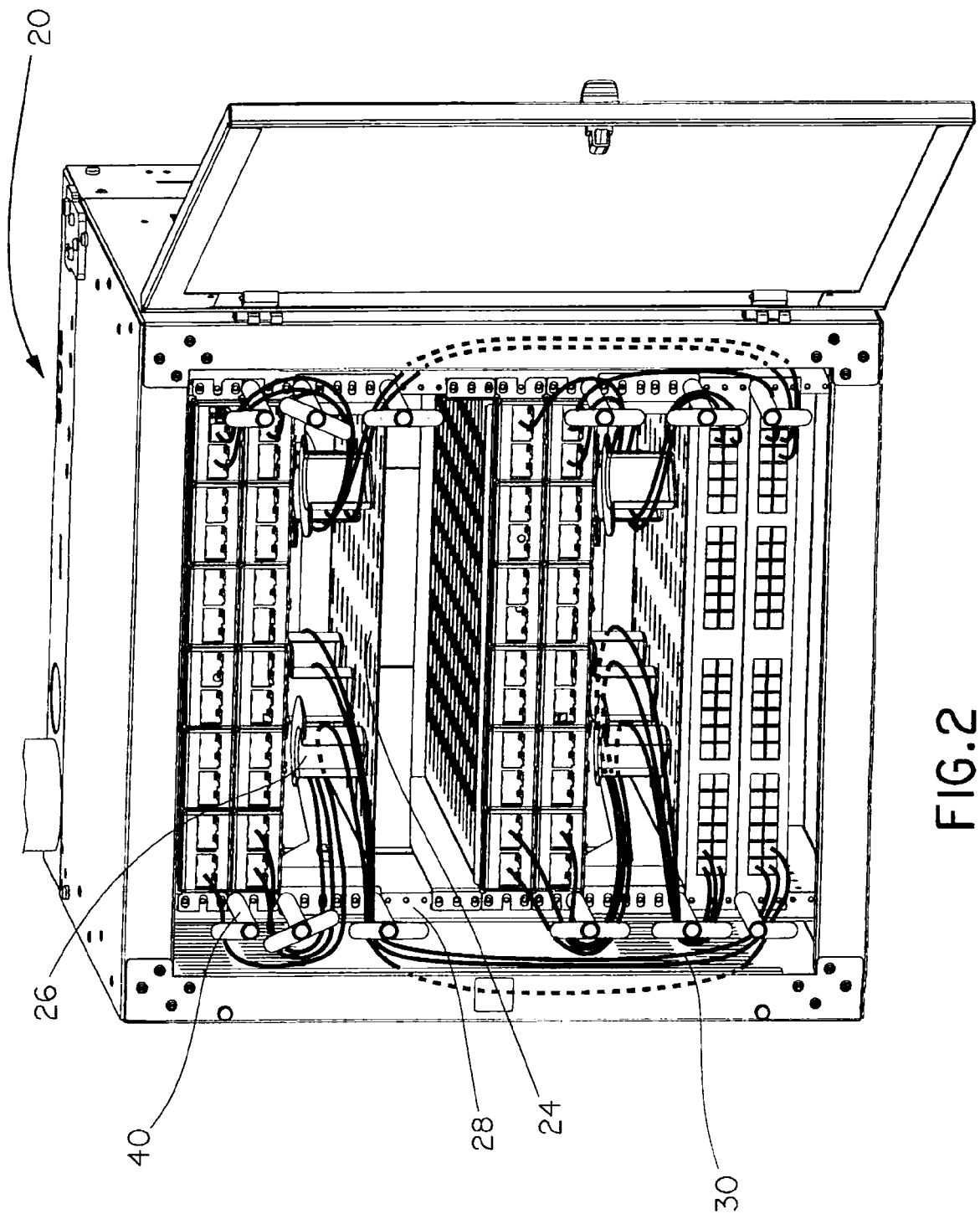
FIG. 2 is a perspective view of the wall mount enclosure and bend radius posts of FIG. 1 with a plurality of cables.
Figure 3:
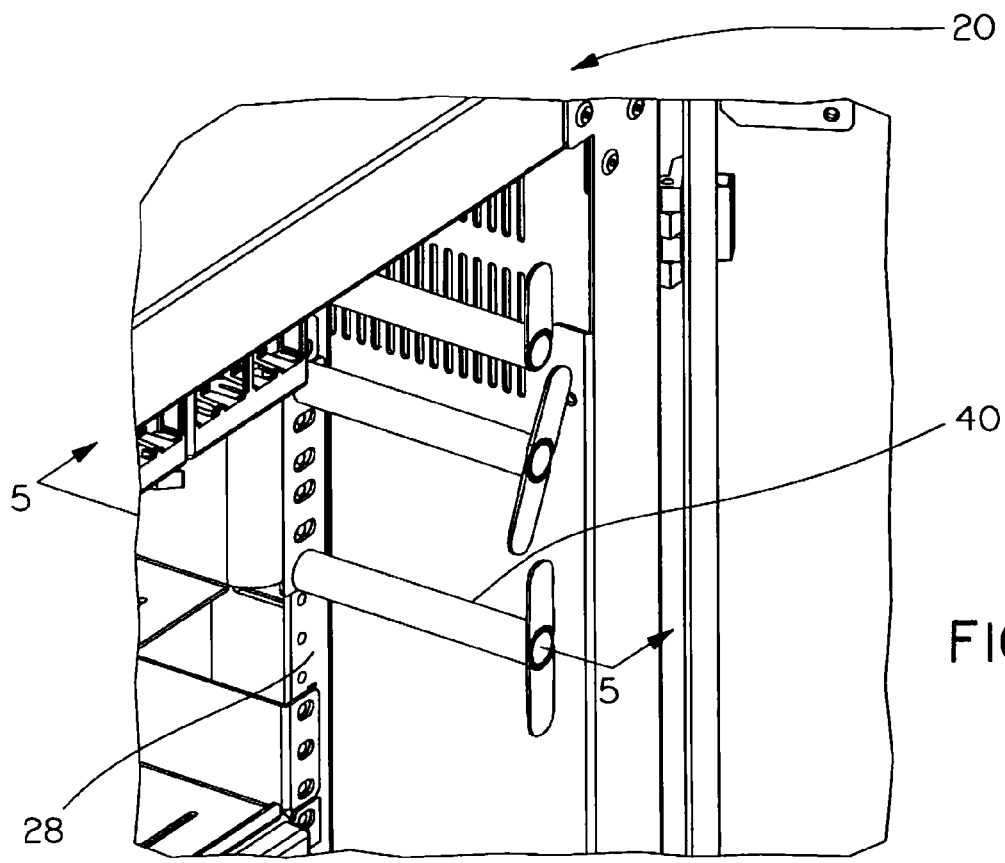
FIG. 3 is a partial perspective view of the bend radius posts installed in the wall mount enclosure of FIG. 1.

FIGS. 1 and 2 illustrate the wall mount enclosure 20 and the cable management apparatus 22 of the present invention. The cable management apparatus 22 includes a horizontal cable manager 24 with slack management members 26 as illustrated and described in co-pending, co-owned application Ser. No. 11/946,974 (LCB 563), the disclosure of which is hereby incorporated by reference in its entirety. The cable management apparatus 22 also includes molded bend radius posts 40 for managing cables 30 entering and exiting the horizontal cable manager.

As illustrated in FIGS. 1-4, the bend radius posts 40 include a cylindrical shaft 42 with a first end 43 and a second end 45 and removable retention tabs 46. The bend radius posts 40 are mounted to the vertical rails 28 in the wall mount enclosure 20 at various desired positions. As will be described below, each bend radius post 40 can be positioned at an angle with respect to the vertical rails 28 to accommodate different sized cables.

Figure 4:
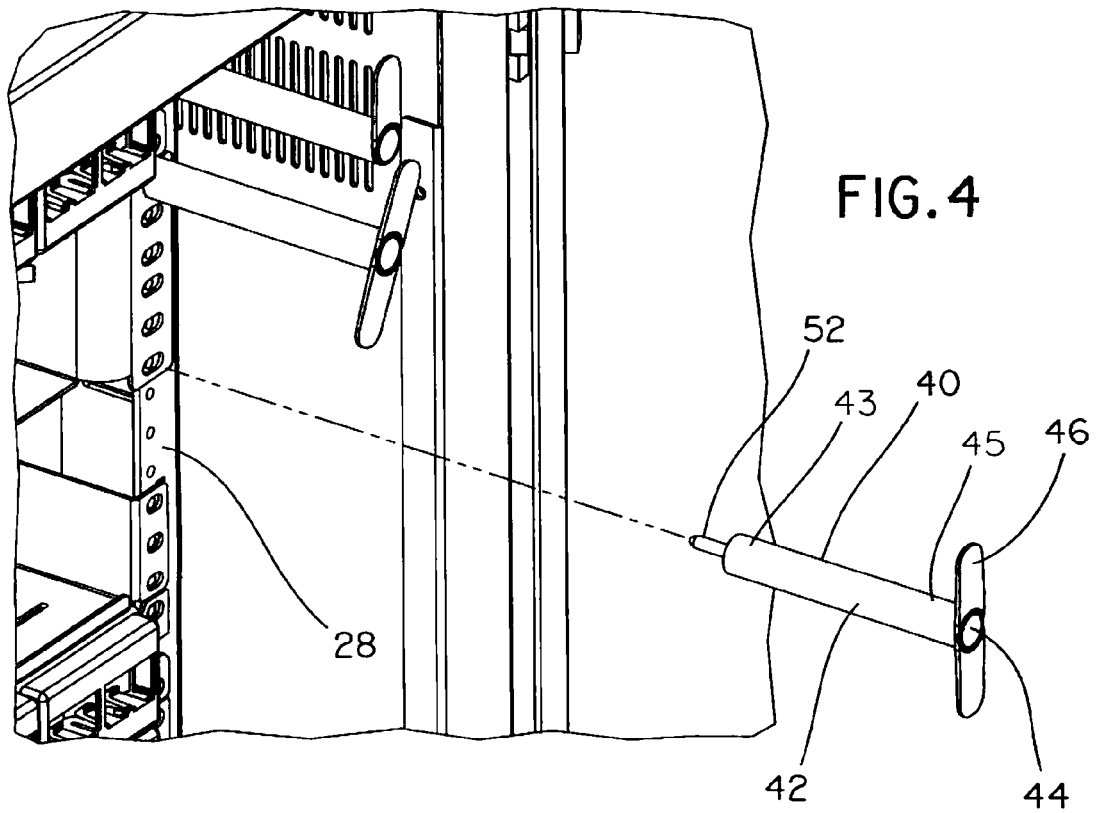
FIG. 4 is a partial exploded view of the bend radius posts and the wall mount enclosure of FIG. 1.
Figure 5:
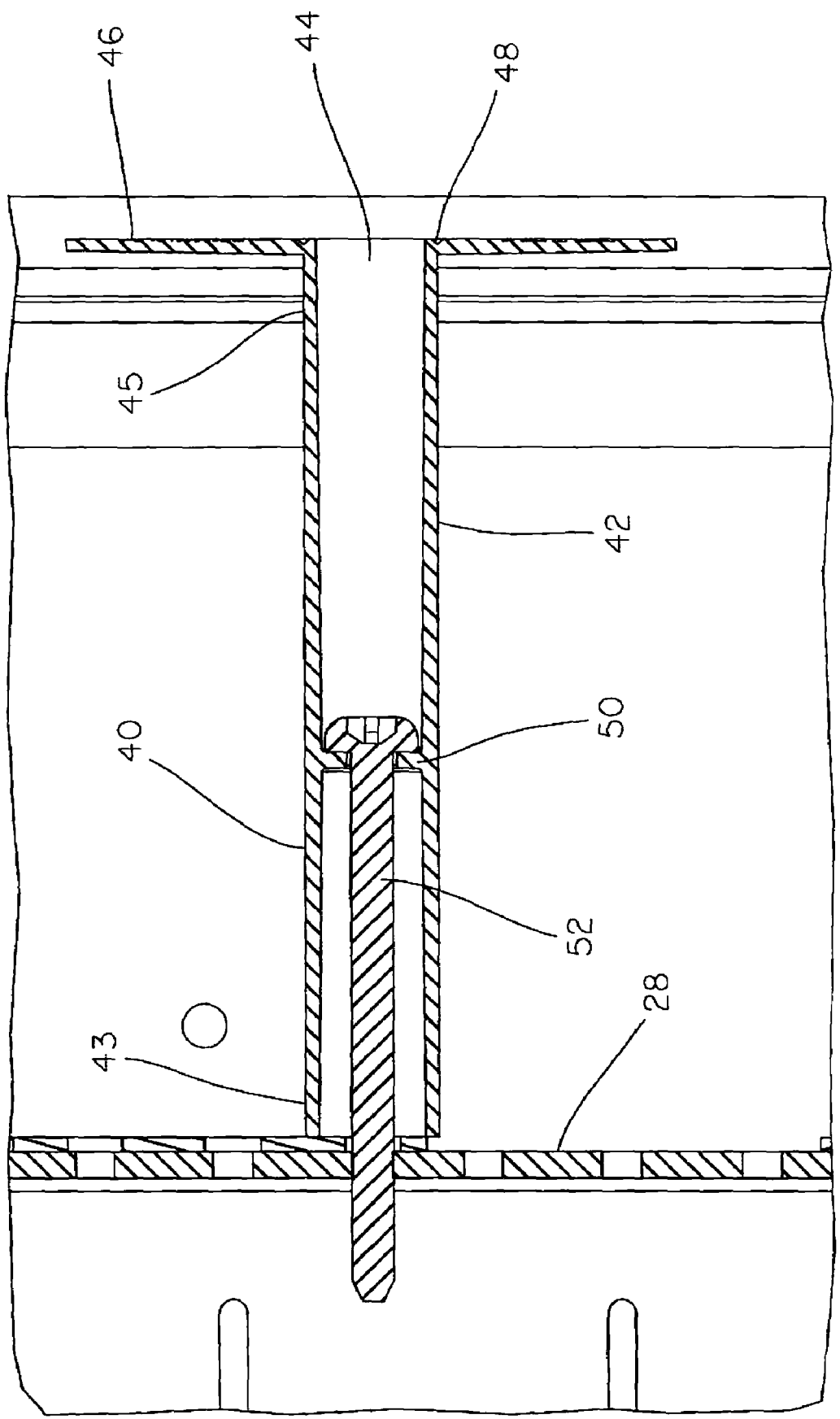
FIG. 5 is a cross sectional view of the bend radius posts of FIG. 3 taken along line 5-5.

As illustrated in FIGS. 4 and 5, the first end 43 of the shaft 42 of each bend radius post 40 is mounted to the vertical rail 28 via a mounting screw 52. The cylindrical shaft 42 of the bend radius post 40 includes a center access hole 44 for receiving the mounting screw 52 and a ledge 50 for supporting the head of the mounting screw 52. The center access hole 44 also accommodates a screwdriver for installing the mounting screw 52 in the vertical rail 28.

Figure 6:
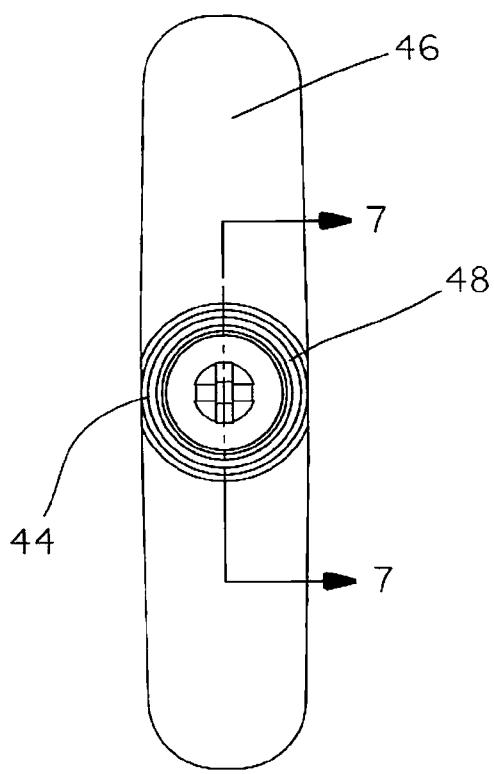
FIG. 6 is top plan view of the bend radius post of FIG. 1.
Figure 7:
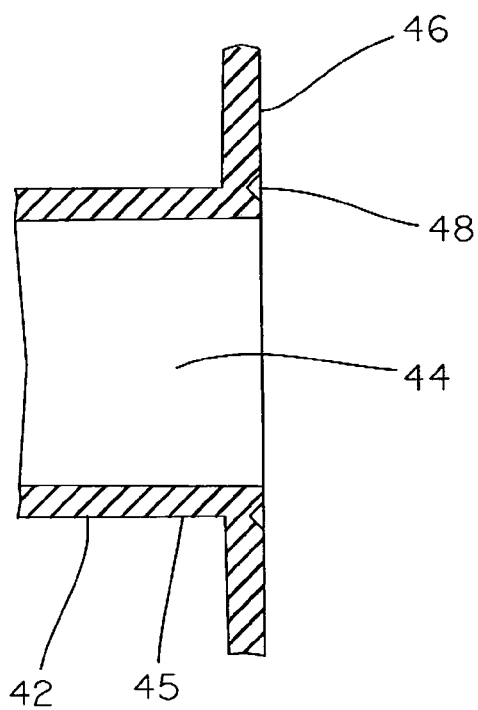
FIG. 7 is a cross sectional view of the bend radius post of FIG. 6 taken along line 7-7.
Figure 8:
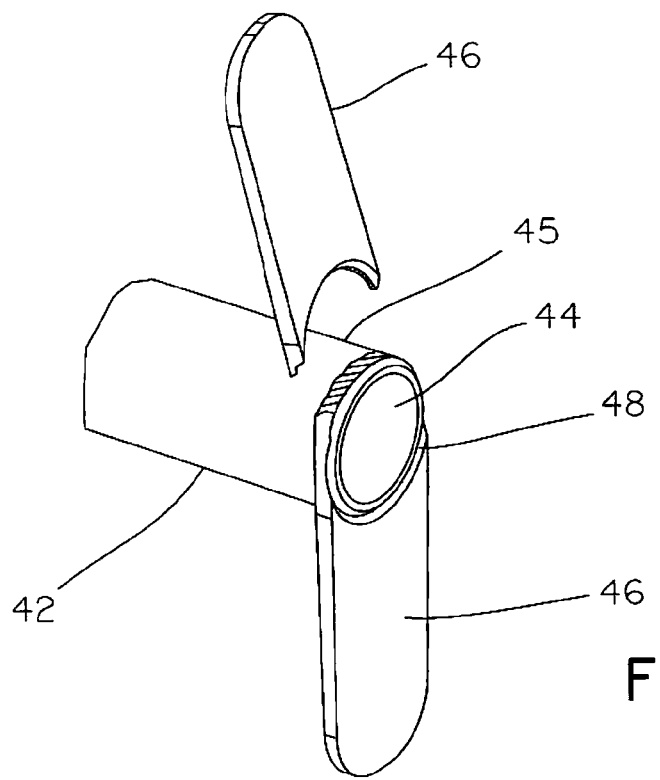
FIG. 8 is an exploded perspective view of the bend radius post of FIG. 1 with one of the retention tabs being removed.

The removable retention tabs 46 are located at the second end 45 of the cylindrical shaft 42 of the bend radius post 40. As illustrated in FIGS. 6-8, each retention tab 46 includes a breakout groove 48. The breakout grove 48 enables the retention tab 46 to be easily removed from the cylindrical shaft 42, when desired, as illustrated in FIG. 8.

Figure 9:
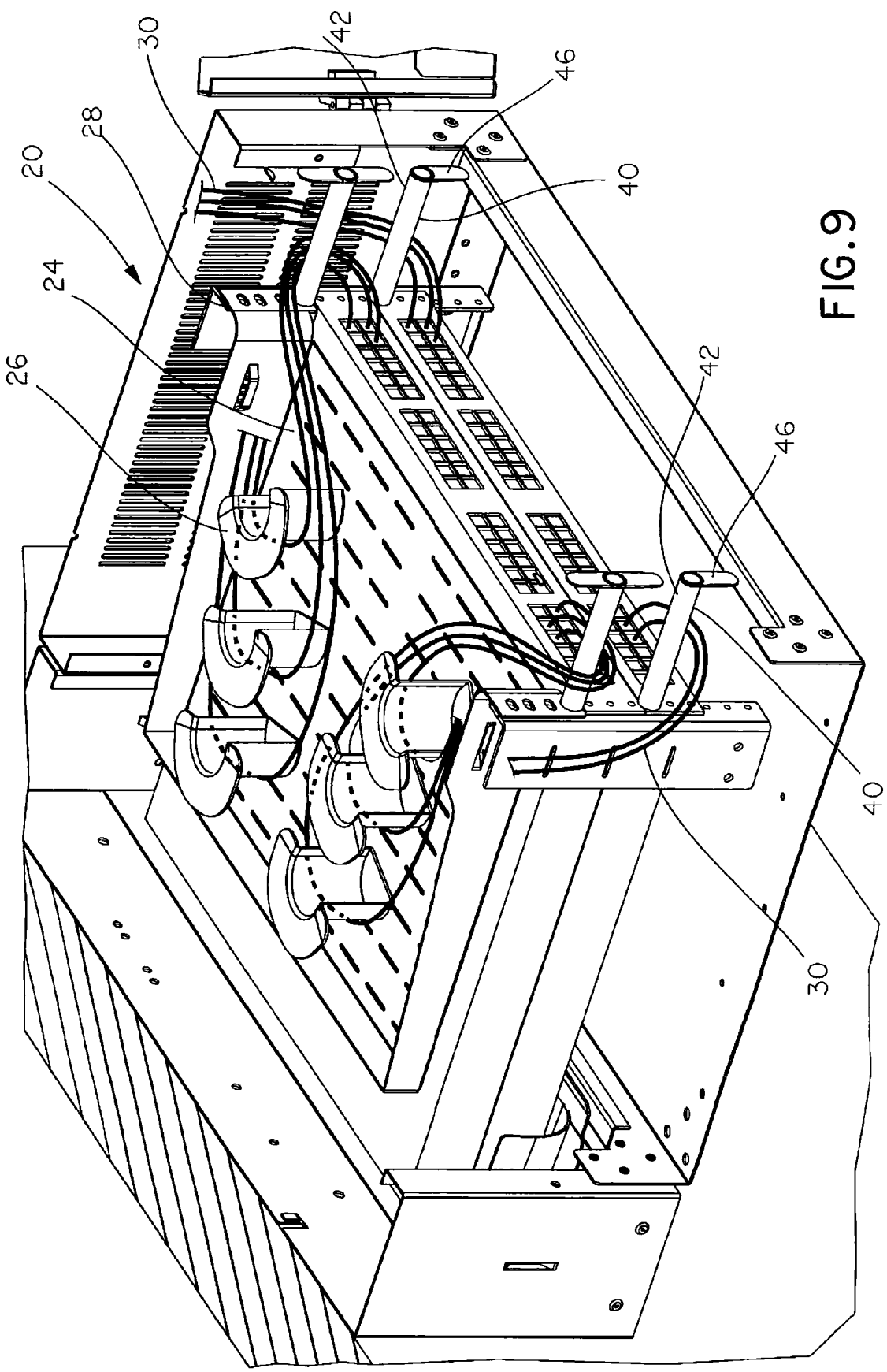
FIG. 9 is a partial cut away assembled view of the wall mount enclosure and bend radius posts of FIG. 1.
Figure 10:
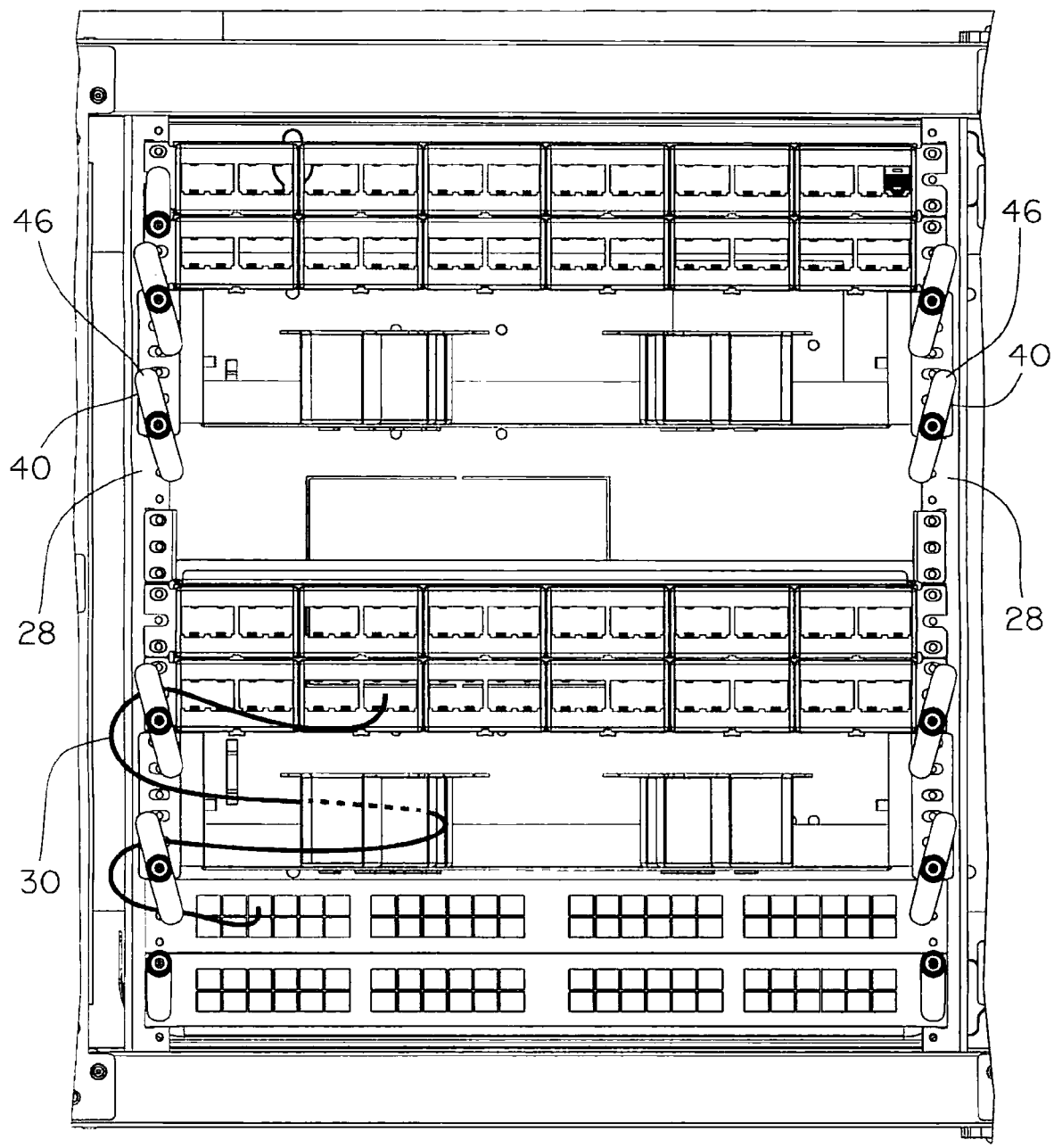
FIG. 10 is a front view of a wall mount enclosure with an alternative arrangement of the bend radius posts.
Figure 11:
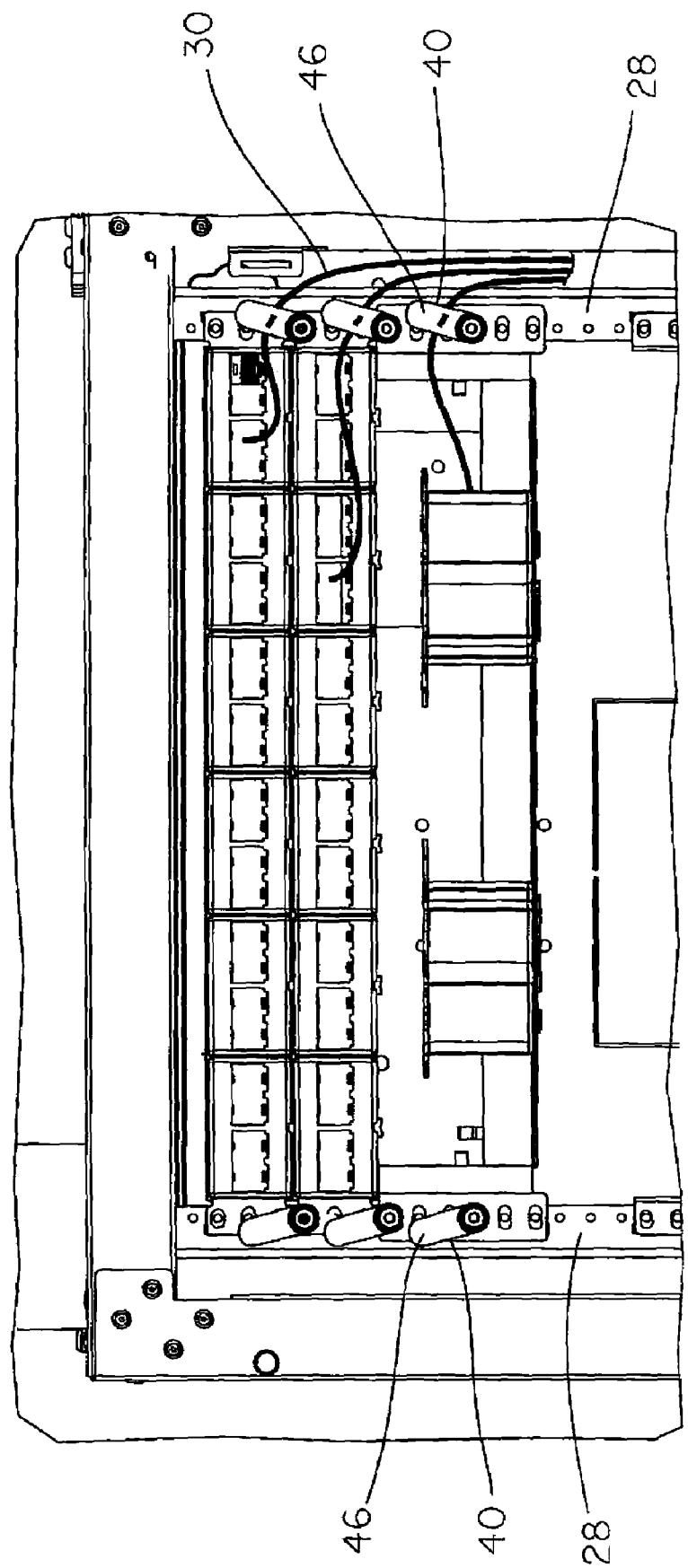
FIG. 11 is a partial front view of a wall mount enclosure with an alternative arrangement of the bend radius posts.

FIGS. 9-11 illustrate the bend radius posts 40 of the present invention in various positions, as desired, along the vertical rail 28. FIG. 9 illustrates the bend radius posts 40 positioned such that the retention tabs 46 are parallel to the vertical rails 28. Additionally, one of the retention tabs 46 from one of the bend radius posts 40 has been removed to accommodate the cabling routed between adjacent bend radius posts 40.

FIG. 10 illustrates an alternative application of the bend radius posts 40 attached to the vertical rails 28. Since each bend radius post 40 is a single entity, each bend radius post 40 may be individually installed to the vertical rail and rotated to accommodate the various sized cabling entering and exiting the horizontal cable manager 24. In FIG. 10, a number of the bend radius posts 40 are mounted such that the tabs 46 are at a 15 degree angle in a spaced relation with respect to each other to provide the required spacing to accommodate Cat 6 cables.

FIG. 11 also illustrates an alternative application of the bend radius posts 40 attached to the vertical rails 28. One of the retention tabs 46 is removed from each of the bend radius posts 40 and the bend radius posts 40 are mounted such that the tabs 46 are at an angle with respect to the vertical rail. This arrangement accommodates IRU spacing.

Furthermore, while the particular preferred embodiments of the present invention have been shown and described, it will be obvious to those skilled in the art that changes and modifications may be made without departing from the teaching of the invention. The matter set forth in the foregoing a description and accompanying drawings is offered by way of illustration only and not as limitation.

The invention claimed is:

1. A cable manager for routing cables in an enclosure, the cable manager comprising:
a bend radius post having a shaft with a first end, a second end and a horizontal axis extending along the shaft, wherein the post is rotatable about the horizontal axis for accommodating a plurality of cable sizes routed in the enclosure,
whereby the first end of the shaft of the bend radius post is mounted to a vertical rail in the enclosure.

2. The cable manager of claim 1, further comprising at least one removable retention tab positioned at the second end of the shaft, wherein the at least one retention tab includes a breakout groove for enabling the at least one retention tab to be removed from the shaft.

3. The cable manager of claim 1, wherein the bend radius post includes a center access hole for receiving a fastener and a ledge for supporting the fastener installed in the bend radius post to mount the bend radius post to the vertical rail in the enclosure.

4. The cable manager of claim 2, wherein the bend radius post is mounted with the at least one removable retention tab parallel to the vertical rail in the enclosure.

5. The cable manager of claim 2, wherein the bend radius post is mounted with the at least one removable retention tab at an angle with respect to the vertical rail in the enclosure.

6. A cable management system comprising:
an enclosure having vertical rails, and
plurality of bend radius posts mounted to the vertical rails, each bend radius post having a shaft with a first end, a second end and a horizontal axis extending along the shaft, wherein the post is rotatable about the horizontal axis for accommodating a plurality of cable sizes routed in the enclosure.

7. The cable manager of claim 6, wherein each bend radius post having at least one removable retention tab, wherein the retention tabs include a breakout groove for enabling each retention tab to be removed from the shaft.

8. The cable manager of claim 6, wherein the bend radius posts include a center access hole for receiving a fastener and a ledge for supporting the fastener installed in each bend radius post to mount the bend radius posts to the enclosure.

9. The cable manager of claim 7, wherein the bend radius posts are mounted with the at least one removable retention tab parallel to the vertical rails in the enclosure.

10. The cable manager of claim 7, wherein the bend radius posts are mounted with the at least one removable retention tab at an angle with respect to the vertical rails in the enclosure.

11. The cable management apparatus of claim 6, wherein each bend radius post is individually mounted to a hole in one of the vertical rails in the enclosure to enable each bend radius post to accommodate the cables routed within the enclosure.

* * * * *